United States Patent
Landru

(10) Patent No.: US 9,224,704 B2
(45) Date of Patent: Dec. 29, 2015

(54) PROCESS FOR REALIZING A CONNECTING STRUCTURE

(75) Inventor: Didier Landru, Champ Pres Froges (FR)

(73) Assignee: SOITEC, Bernin (FR)

( * ) Notice: Subject to any disclaimer, the term of this patent is extended or adjusted under 35 U.S.C. 154(b) by 252 days.

(21) Appl. No.: 13/219,099

(22) Filed: Aug. 26, 2011

(65) Prior Publication Data
US 2012/0094469 A1   Apr. 19, 2012

(30) Foreign Application Priority Data

Oct. 14, 2010 (FR) .................................... 10 04050

(51) Int. Cl.
*H01L 23/48* (2006.01)
*H01L 23/52* (2006.01)
(Continued)

(52) U.S. Cl.
CPC ............... *H01L 24/05* (2013.01); *H01L 24/03* (2013.01); *H01L 25/0657* (2013.01); *H01L 25/50* (2013.01); *H01L 24/80* (2013.01); *H01L 24/94* (2013.01); *H01L 2224/034* (2013.01);
(Continued)

(58) Field of Classification Search
CPC ...................... H01L 21/76254; H01L 21/2007; H01L 21/76251
USPC .......... 438/455, 652, 653, 456; 257/751, 758, 257/767
See application file for complete search history.

(56) References Cited

U.S. PATENT DOCUMENTS

| 5,419,806 A | 5/1995 | Huebner |
| 6,962,835 B2 | 11/2005 | Tong et al. .................... 438/108 |

(Continued)

FOREIGN PATENT DOCUMENTS

| JP | 3106012 A | 5/1991 |
| JP | 6260594 A | 9/1994 |
| JP | 2011049270 A | 3/2011 |

OTHER PUBLICATIONS

French Search Report, FR 1004050 and Written Opinion, mailed Mar. 22, 2011.
(Continued)

*Primary Examiner* — Michael Jung
*Assistant Examiner* — Charles R Peters
(74) *Attorney, Agent, or Firm* — TraskBritt

(57) ABSTRACT

The present invention relates to a process for realizing a connecting structure in a semiconductor substrate, and the semiconductor substrate realized accordingly. The semiconductor substrate has at least a first surface, and is foreseen for a 3D integration with a second substrate along the first surface, wherein the 3D integration is subject to a lateral misalignment in at least one dimension having a misalignment value. This process includes growing a diffusion barrier structure for preventing diffusion of elements out of a conductive layer into the rest of the semiconductor substrate, wherein a first end surface, being the most outward surface of the diffusion barrier structure and being substantially parallel to the first surface, along a direction perpendicular to the first surface and going from the substrate toward the first surface, of the diffusion barrier structure can have a length, in the direction of the lateral misalignment, the length being dependent on the misalignment value, wherein the length of the diffusion barrier structure is chosen such that in a 3D integrated structure a diffusion of elements out of a conductive layer of the second substrate is prevented in the integrated state.

15 Claims, 10 Drawing Sheets

(51) Int. Cl.
*H01L 29/40* (2006.01)
*H01L 21/30* (2006.01)
*H01L 21/46* (2006.01)
*H01L 23/00* (2006.01)
*H01L 25/065* (2006.01)
*H01L 25/00* (2006.01)

(52) U.S. Cl.
CPC . *H01L2224/0332* (2013.01); *H01L 2224/0345* (2013.01); *H01L 2224/03452* (2013.01); *H01L 2224/03462* (2013.01); *H01L 2224/03616* (2013.01); *H01L 2224/05006* (2013.01); *H01L 2224/05082* (2013.01); *H01L 2224/05139* (2013.01); *H01L 2224/05144* (2013.01); *H01L 2224/05147* (2013.01); *H01L 2224/05181* (2013.01); *H01L 2224/05186* (2013.01); *H01L 2224/05187* (2013.01); *H01L 2224/05546* (2013.01); *H01L 2224/05547* (2013.01); *H01L 2224/05576* (2013.01); *H01L 2224/05578* (2013.01); *H01L 2224/05639* (2013.01); *H01L 2224/05644* (2013.01); *H01L 2224/05647* (2013.01); *H01L 2224/05681* (2013.01); *H01L 2224/05687* (2013.01); *H01L 2224/08121* (2013.01); *H01L 2224/80203* (2013.01); *H01L 2224/80357* (2013.01); *H01L 2224/80895* (2013.01); *H01L 2225/06513* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01029* (2013.01); *H01L 2924/01032* (2013.01); *H01L 2924/01033* (2013.01); *H01L 2924/01047* (2013.01); *H01L 2924/01073* (2013.01); *H01L 2924/01075* (2013.01); *H01L 2924/01079* (2013.01); *H01L 2924/10329* (2013.01); *H01L 2924/15788* (2013.01)

(56) References Cited

U.S. PATENT DOCUMENTS

| | | | | |
|---|---|---|---|---|
| 7,998,864 | B2* | 8/2011 | Yang et al. | 438/686 |
| 2003/0148590 | A1* | 8/2003 | Kellar et al. | 438/455 |
| 2006/0234473 | A1 | 10/2006 | Wong et al. | 438/455 |
| 2006/0292823 | A1* | 12/2006 | Ramanathan et al. | 438/455 |
| 2007/0037379 | A1 | 2/2007 | Enquist et al. | 438/618 |
| 2007/0284409 | A1 | 12/2007 | Kobrinsky et al. | 228/44.7 |
| 2008/0142991 | A1 | 6/2008 | Wong et al. | 257/777 |
| 2009/0068831 | A1 | 3/2009 | Enquist et al. | 438/618 |
| 2009/0189287 | A1 | 7/2009 | Yang et al. | |
| 2011/0042814 | A1* | 2/2011 | Okuyama | 257/758 |
| 2012/0094469 | A1* | 4/2012 | Landru | 438/455 |

OTHER PUBLICATIONS

Di Cioccio et al., Enabling 3D Interconnects with Metal Direct Bonding, Interconnect Technology Conference 2009, IITC 2009, IEEE International, Jun. 1-3, 2009, 3 pages.

Chinese Office Action for Chinese Application No. 201110307001.7 dated Aug. 8, 2014.

* cited by examiner

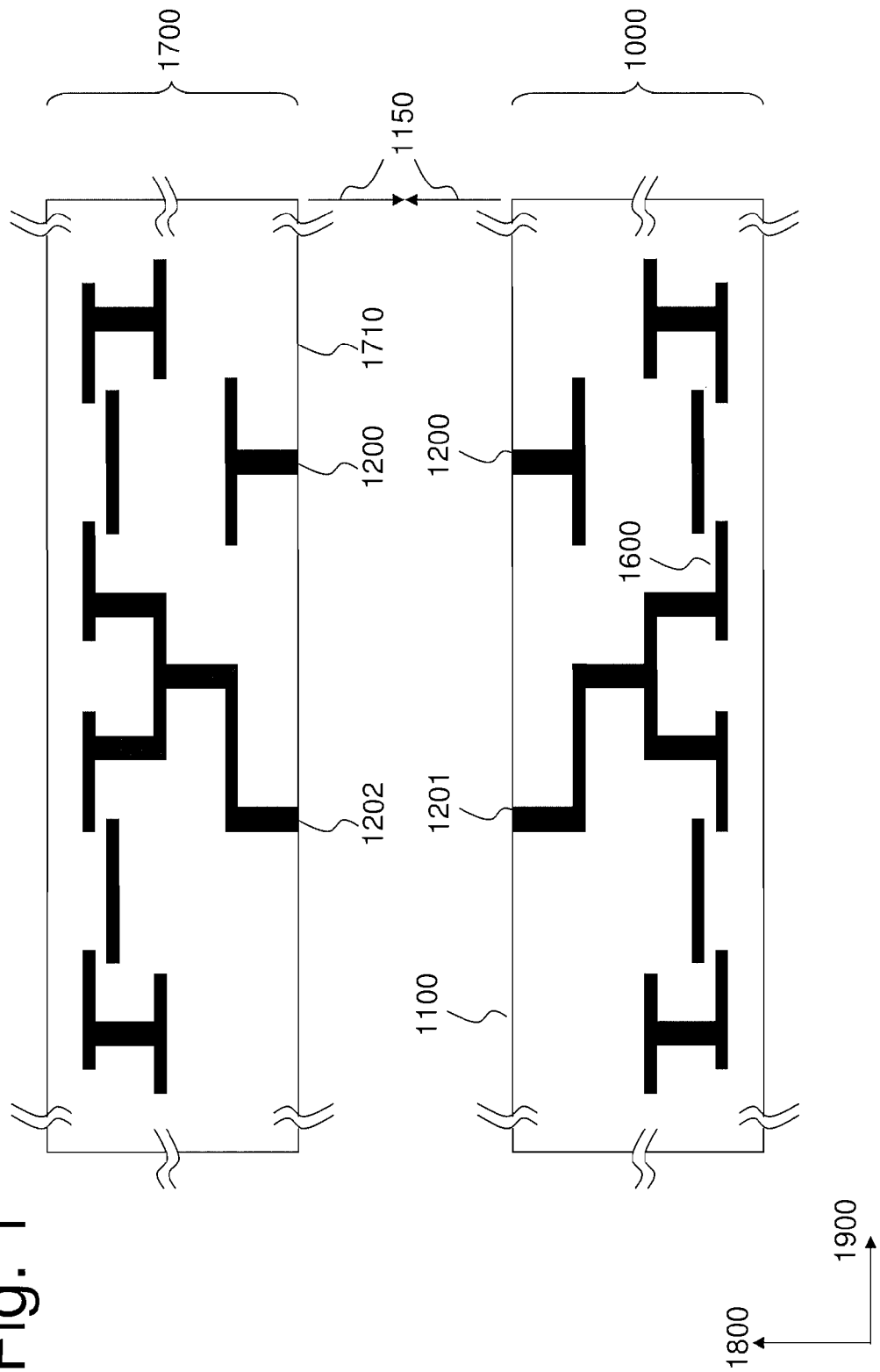

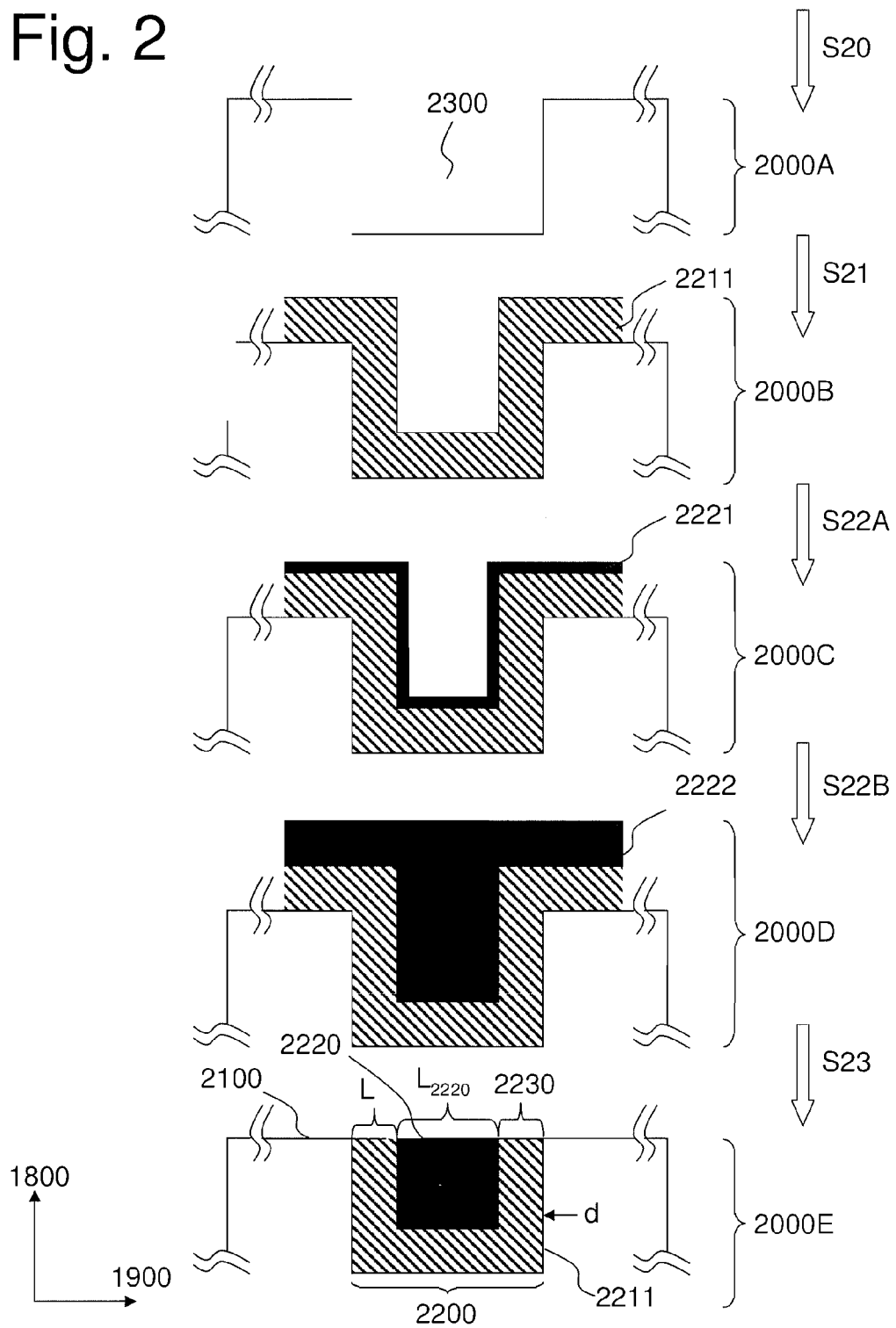

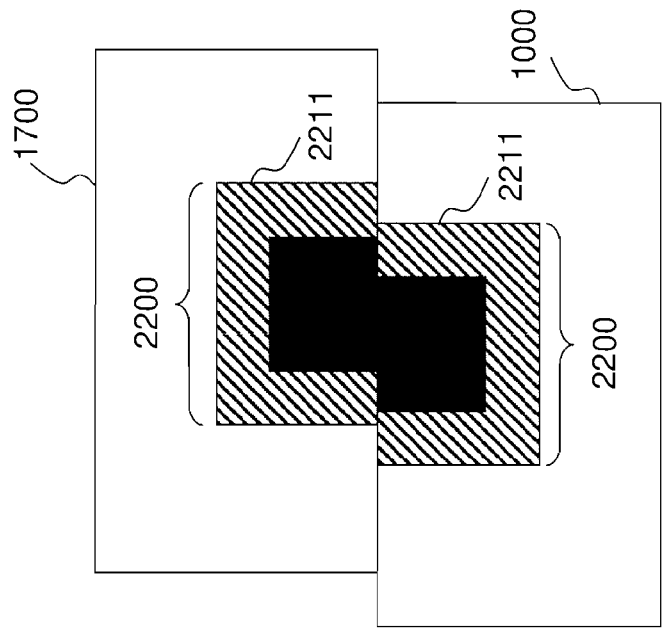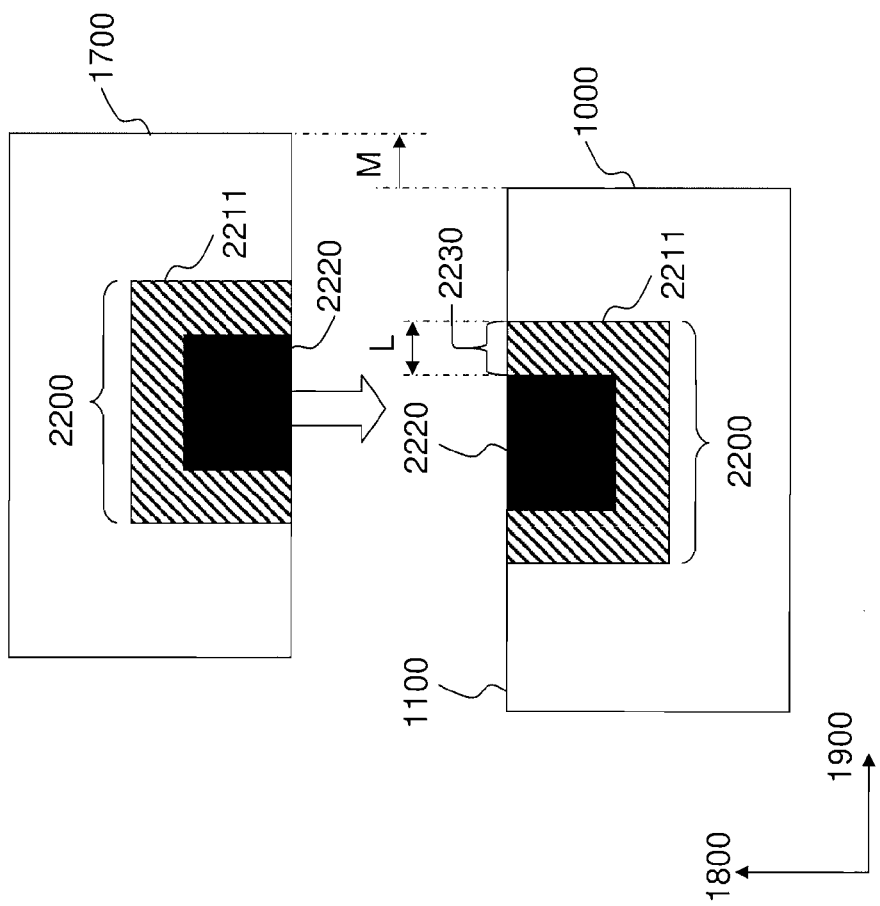

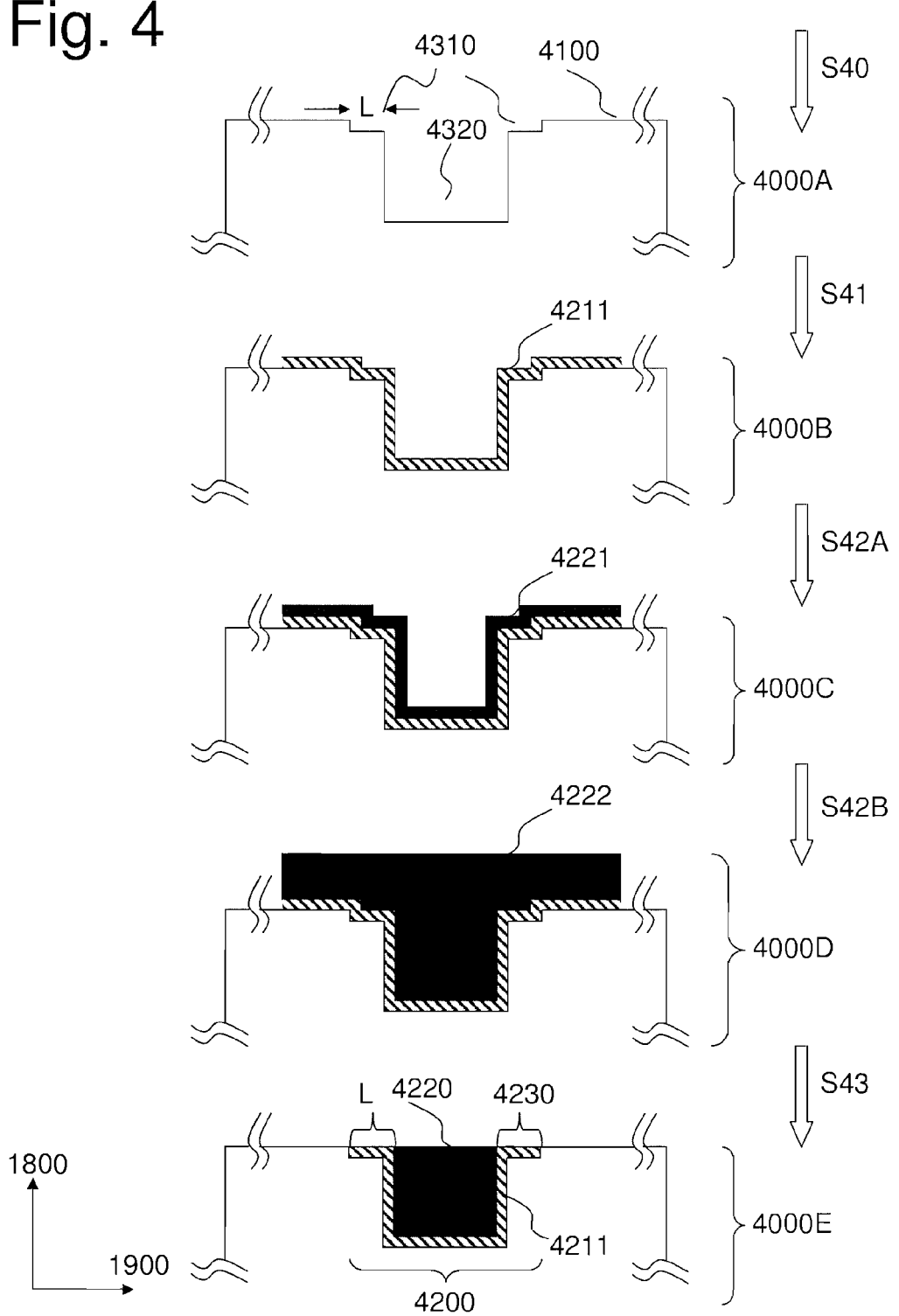

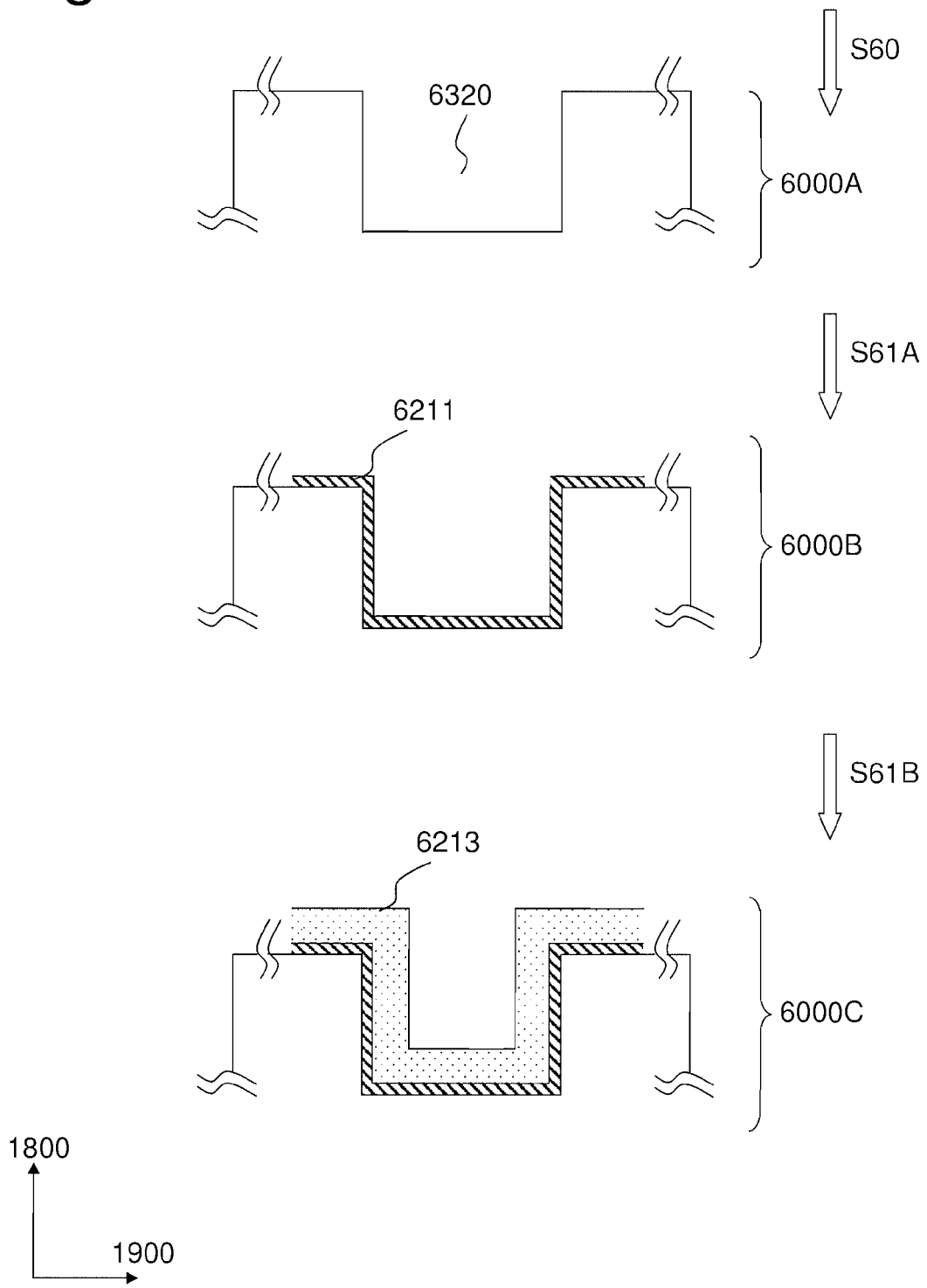

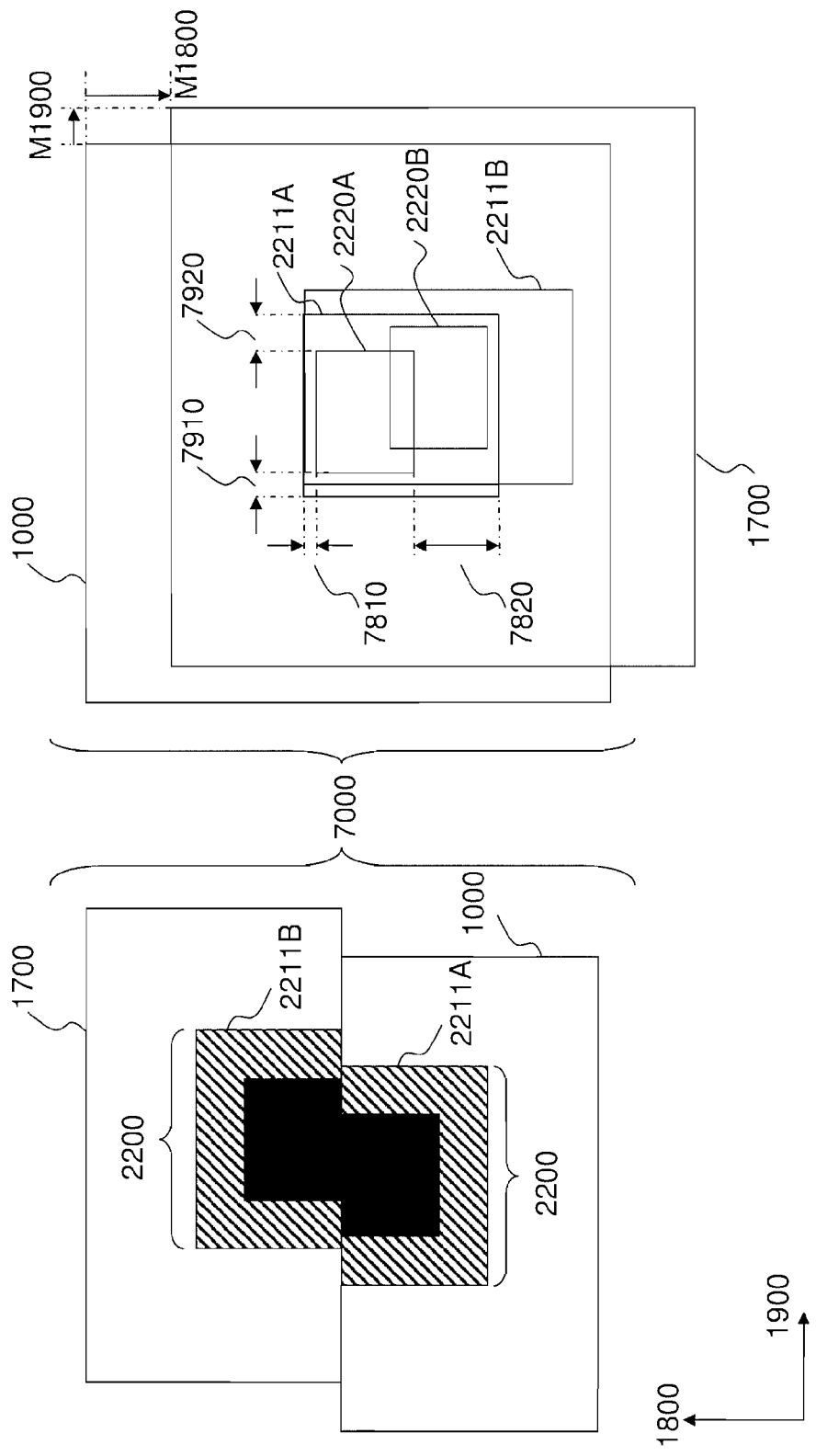

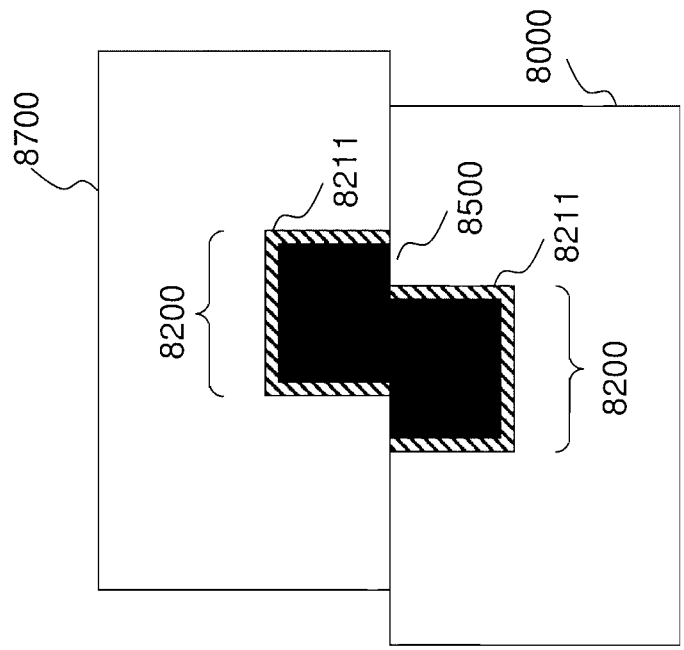
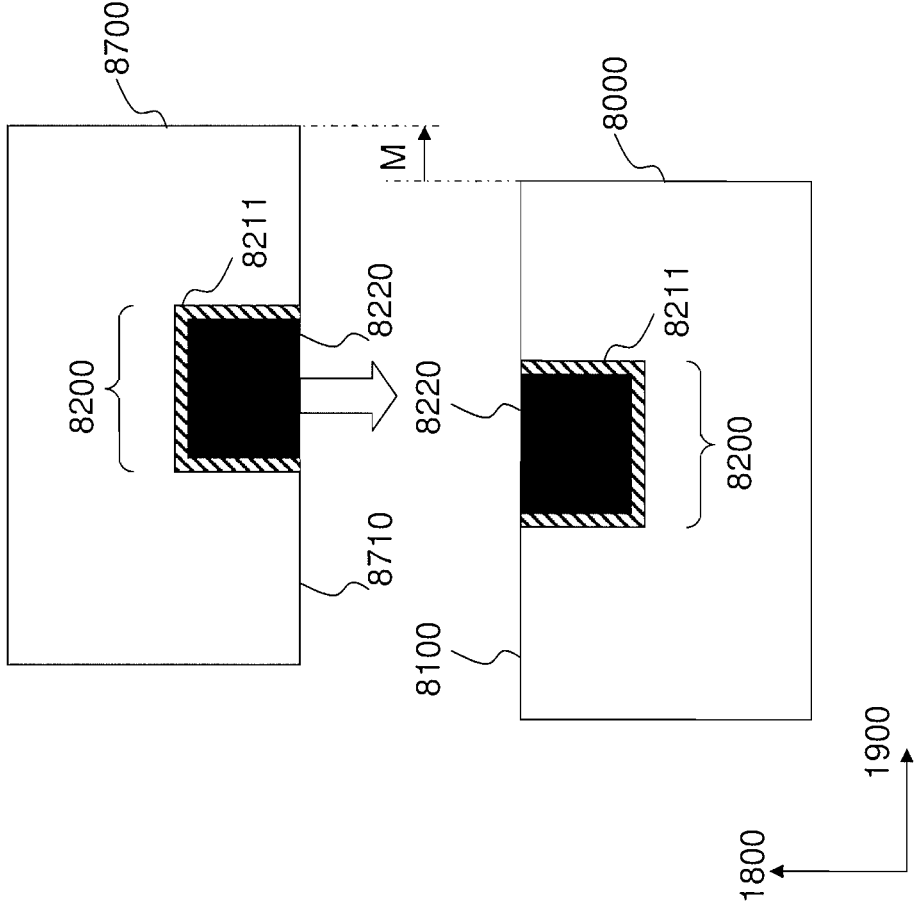

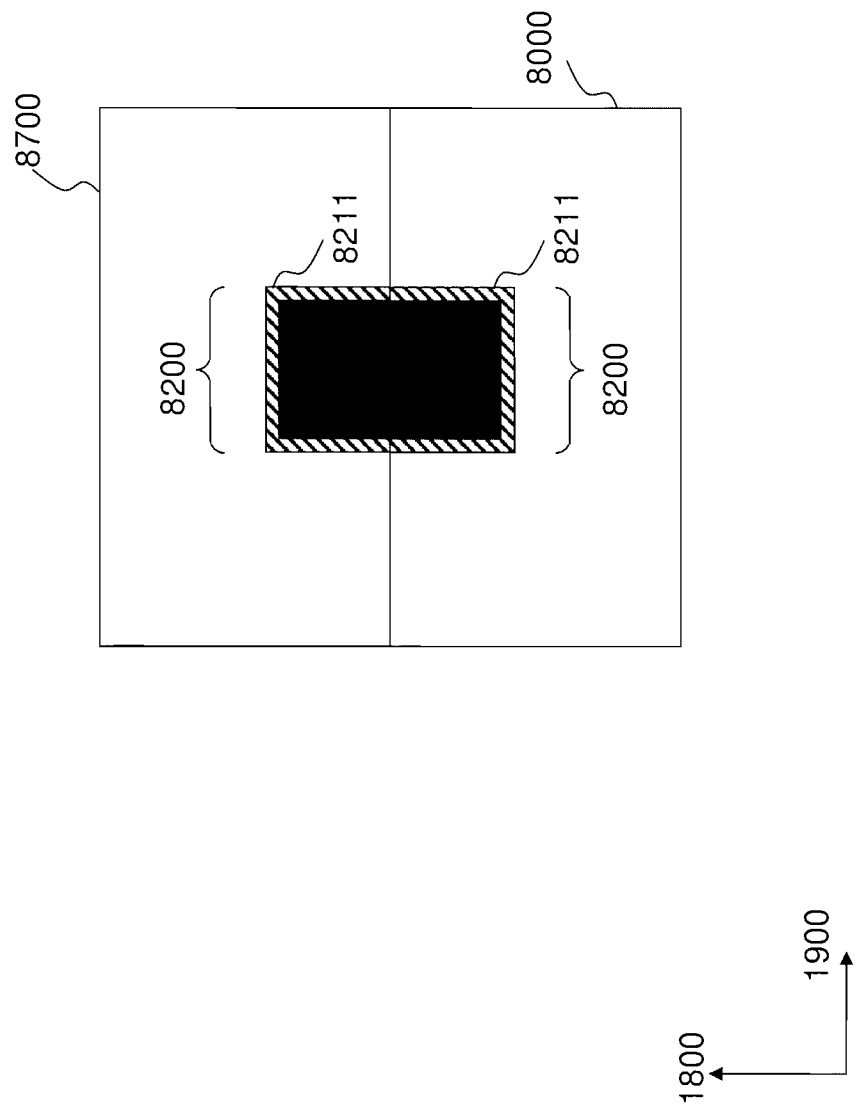

PROCESS FOR REALIZING A CONNECTING STRUCTURE

TECHNICAL FIELD

The present invention relates to a process for realizing a connecting structure in a semiconductor substrate and a semiconductor system including a semiconductor substrate in which such a connecting structure has been realized.

BACKGROUND

As standard semiconductor manufacturing techniques are pushed toward shorter gate length, they approach the manufacturing limit of classic semiconductor technology. In order to further improve performances, reduce power consumption and packaging costs, integration techniques, such as 3D integration are becoming more and more common.

3D integration consists in connecting at least two modules such as a semiconductor die, an optical module, a heat dissipation module, a biological module, and a memory, by stacking them one upon each other. Such an approach has several advantages. PCB-requirements are more relaxed since the integration is performed on a vertical direction. Power consumption of the input/output interfaces as well as signal quality are improved by connecting the modules to each other without making usage of long connecting cables or lines. Costs are reduced since a single package is required instead of a multitude of packages. Such integration technique allows miniaturization of a high complexity system within a single package.

Various techniques for connecting the multitude of modules stacked one upon the other have been developed. In order to connect at least two modules one upon each other, one possible technique consists in direct bonding. In such a technique, two modules, for instance, two semiconductor dies, are placed one upon each other and pressed against each other at a relatively low temperature, so that electrical contacts at the interface between the two dies can be created.

For instance, as can be seen in FIG. 8A, a first semiconductor die 8000 having a first surface 8100 might include a connecting structure 8200 composed by a conductive layer 8220 surrounded by a diffusion barrier layer 8211. At the same time, a second semiconductor die 8700 might have a first surface 8710 and might incorporate a connecting structure 8200 including a conductive layer 8220 and a diffusion barrier layer 8211. The connecting structure 8200 of the first semiconductor die 8000 and the connecting structure 8200 of the second semiconductor die 8700 might be substantially similar.

3D integration might be performed by pressing the second semiconductor die 8700 on top of the first semiconductor die 8000 such that the first surface 8710 of the second semiconductor die 8700 presses against the first surface 8100 of the first semiconductor die 8000. During such a procedure, the first semiconductor die 8000 and the second semiconductor die 8700 should be aligned, at least along a direction 1900, so that the connecting structure 8200 of the first semiconductor die 8000 is aligned with the substantially similar connecting structure 8200 of the second semiconductor die 8700. This is illustrated in FIG. 8B and U.S. Pat. No. 6,962,835.

Due to technological limits, however, a perfect alignment as shown in FIG. 8B can be hard to achieve. Practically, a small misalignment can be present, at least in one direction. As an example, in direction 1900, as illustrated by the misalignment value M in FIG. 8A. When such a 3D integration is performed subjected to the misalignment value M, a result as illustrated in FIG. 8C can be obtained.

As can be seen in FIG. 8C, the connecting structure 8200 of the first semiconductor die 8000 might not be aligned with the connecting structure 8200 of the second semiconductor die 8700. A mismatch region 8500 can therefore be present, in which the conductive layer 8220 of the connecting structure 8200 of the second semiconductor die 8700 is placed above the diffusion barrier layer 8211 of the connecting structure 8200 of the first semiconductor die 8000 as well as being placed over a region of the semiconductor die 8000 not including the connecting structure 8200 of the first semiconductor die 8000.

In such a case, if, for example, the conductive layer 8220 of the connecting structure 8200 of the second semiconductor die 8700 is realized with copper, and the first semiconductor die is, for example, a silicon semiconductor die, there might be the possibly of the copper diffusing into the part of the first semiconductor die 8000 not corresponding to the connecting structure 8200 of the first semiconductor die 8000 through region 8500.

This problem is present in current 3D integration techniques and can therefore prevent or limit the application of such techniques in industrial manufacturing of integrated systems. Thus, improvements in this area are needed.

BRIEF SUMMARY

Accordingly, the present invention now provides a connecting structure to be used in a semiconductor substrate subjected to 3D integration such that diffusion of the metal composing the connecting structure is prevented, even in the presence of a misalignment during the 3D integration process.

In particular, the present invention relates to a process for realizing a connecting structure in a semiconductor substrate, according to an embodiment of the present invention, the semiconductor substrate having at least a first surface, and being foreseen for a 3D integration with a second substrate along the first surface, wherein the 3D integration is subject to a lateral misalignment in at least one dimension having a misalignment value (M), can include the step of growing a diffusion barrier structure for preventing diffusion of elements out of a conductive layer into the rest of the semiconductor substrate, is characterized in that a first end surface, being the most outward surface of the diffusion barrier structure being substantially parallel to the first surface, along a direction perpendicular to the first surface and going from the substrate toward the first surface, of the diffusion barrier structure can have a length, in the direction of the lateral misalignment, the length being dependent on the misalignment value, wherein the length of the diffusion barrier structure is chosen such that in a 3D integrated structure a diffusion of elements out of a conductive layer of the second substrate is prevented in the integrated state.

By carrying out such process, it is possible to realize a connecting structure which can be aligned during a 3D integration process, to a corresponding connecting structure on the first integrated substrate, even in the presence of a misalignment during the 3D integration. By taking into account the misalignment value, the diffusion barrier structure can be sized so as to compensate for the misalignment and prevent diffusion of a conductive element.

In some embodiments, the length can be at least as long as the lateral misalignment value.

By choosing the length of the diffusion barrier structure so that it is as least the misalignment value, even in the case of maximum misalignment, prevention of diffusion of the conductive element can be ensured.

In some embodiments, the length can be at least as long as a length of the conductive layer of the second substrate along the direction of the misalignment.

By choosing the length of the diffusion barrier structure so that it is as least as long as a length of the conductive layer of the second substrate along the direction of the misalignment, prevention of diffusion of the conductive element can be ensured whenever a contact between the conductive layers of the first and second substrate is achieved.

In some embodiments, the process for realizing a connecting structure can further include a step of growing, after having grown the diffusion barrier structure, at least a conductive layer so that the conductive layer is separated from the semiconductor substrate by at least the diffusion barrier structure.

By growing a conductive element after having grown the diffusion barrier structure, it is possible to realize a diffusion barrier structure having a length of the first end surface corresponding to the thickness of the diffusion barrier structure, and then deposit the conductive element directly on top of the diffusion barrier structure. In such way, only two deposits, the diffusion barrier structure and the conductive element, are needed.

In some embodiments, the process for realizing a connecting structure can further include a step of growing, before growing the diffusion barrier structure, at least a conductive layer.

By growing a conductive element before growing the diffusion barrier structure, it is possible to realize a diffusion barrier structure having the required length, only in specific zones with respect to the position of the already grown conductive element.

In some embodiments, the step of growing the diffusion barrier structure can include a step of growing a diffusion barrier layer.

By using a diffusion barrier layer as a diffusion barrier structure, the process of growing a diffusion barrier structure could be precisely controlled. Moreover, by using the diffusion barrier layer as a diffusion barrier structure, only a single manufacturing step might be needed in order to grow the diffusion barrier structure.

In some embodiments, the step of growing the diffusion barrier structure can further comprise a step of growing a second layer on the diffusion barrier layer having a growing rate higher than the diffusion barrier layer.

By using two layers for growing the diffusion barrier structure, it is possible to employ one thinner diffusion barrier layer, having a low growth rate, and a second layer having a faster grow ratio. In such a case, it could be possible to deposit both layers using the same set of mask. However, thanks to the faster growing rate of the second layer, a quicker production could be obtained.

In some embodiments, the step of growing the diffusion barrier layer can comprise growing a layer of at least one of Tantalum (Ta), Tantalum nitride (TaN), Silicon nitride (Si3N4).

By choosing the diffusion barrier layer between those elements, an optimal effect of preventing the diffusion of conductive material can be achieved.

In some embodiments, the length of the diffusion barrier structure can be between 20 nm and 1 μm.

By growing the diffusion barrier structure with a length that is substantially longer than the usual length of a standard diffusion barrier layer, the advantage of preventing conductive element diffusion, even in the case of misalignment, can be achieved.

A process for realizing a 3D integration of at least two semiconductor substrates, according to a further embodiment of the present invention, can include the steps of: realizing a connecting structure in at least one preferably each one of the two semiconductor substrates according to the process for realizing a connecting structure in a semiconductor substrate, according to an embodiment of the present invention as described above; attaching the two semiconductor substrates along the first surface of each of the two semiconductor substrates.

By realizing the 3D integration using two substrates obtained by the process for realizing a connecting structure in a semiconductor substrate, according to an embodiment of the present invention, it is possible to realize a connection between the two substrates, capable of preventing undesired diffusion of conductive material even in the presence of misalignment during the 3D integration process.

In some embodiments, the step of attaching the two semiconductor substrates can include a step of attaching, in particular by bonding, the two semiconductor substrates to each other.

By bonding the two substrates to each other, a stable connection can be ensured, and a further misalignment of the connection regions can be prevented.

A semiconductor system, according to a further embodiment of the present invention, can include at least a first substrate and a second substrate, at least the first substrate including a connecting structure, wherein the first substrate has at least a first surface, and is 3D integrated with the second substrate along the first surface, wherein the 3D integration has a lateral misalignment in at least one dimension having a misalignment value (M); and the connecting structure includes a diffusion barrier structure for preventing diffusion of elements out of a conductive layer into the material of the substrate, characterized in that, the diffusion barrier structure is configured so that a first end surface, being the most outward surface of the diffusion barrier structure being substantially parallel to the first surface, along a direction perpendicular to the first surface and going from the substrate toward the first surface, of the diffusion barrier structure has a length (L), in the direction of the lateral misalignment, the length being dependent on the misalignment value, wherein the length (L) of the diffusion barrier structure is chosen such that a diffusion of elements out of a conductive layer of the second substrate is prevented.

By realizing a semiconductor system in such a manner, it is possible to realize a stable electrical connection during a 3D integration process, between corresponding connecting structures on the first and second substrates, even in the presence of a misalignment during the 3D integration. By taking into account the misalignment value, the diffusion barrier structure can be sized so as to compensate for the misalignment and prevent diffusion of a conductive element.

In some embodiments, the length can be at least as long as the lateral misalignment value.

By choosing the length of the diffusion barrier structure so that it is as least the misalignment value, even in the case of maximum misalignment, prevention of diffusion of the conductive element can be ensured.

In some embodiments, the length can be at least as long as a length of the conductive layer of the second substrate along the direction of the misalignment.

By choosing the length of the diffusion barrier structure so that it is as least as long as a length of the conductive layer of the second substrate along the direction of the misalignment, prevention of diffusion of the conductive element can be ensured whenever a contact between the conductive layers of the first and second substrate is achieved.

In some embodiments, the connecting structure can further include at least a conductive layer so that the conductive layer is separated from the first substrate by at least the diffusion barrier structure.

By separating the conductive element from the substrate by means of the diffusion barrier structure, it could be possible to use the diffusion barrier structure both in order to prevent the diffusion of the conductive element of the connecting structure of the first substrate into the first substrate as well as preventing the diffusion of the conductive element of the connecting structure of the second substrate into the first substrate.

In some embodiments, the diffusion barrier structure can include a diffusion barrier layer.

By using a diffusion barrier layer as a diffusion barrier structure, the process of growing a diffusion barrier structure could be precisely controlled. Moreover, by using the diffusion barrier layer as a diffusion barrier structure, only a single manufacturing step might be needed in order to grow the diffusion barrier structure.

In some embodiments, the diffusion barrier structure can include a diffusion barrier layer and a second layer on the diffusion barrier layer having a growing rate higher than the diffusion barrier layer.

By using two layers for growing the diffusion barrier structure, it is possible to employ one thinner diffusion barrier layer, having a low growth rate, and a second layer having a faster grow ratio. In such a case, it could be possible to deposit both layers using the same set of mask. However, thanks to the faster growing rate of the second layer, a quicker production could be obtained.

In some embodiments, the diffusion barrier layer can be any of tantalum (Ta), tantalum nitride (TaN), or silicon nitride (Si3N4).

Preferably, the connecting structure is defined by a hole in the substrate, the diffusion barrier being provided in the hole on the sidewall and bottom thereof, and conductive material is provided in the hole on the diffusion barrier, wherein the diffusion barrier has a thickness on the hole sidewall that is at least the same as the misalignment value.

By choosing the diffusion barrier layer between those elements, an optimal effect of preventing the diffusion of conductive material can be achieved.

BRIEF DESCRIPTION OF THE DRAWINGS

The accompanying drawings are incorporated into and form a part of a specification to illustrate several embodiments of the present invention. These drawings together with the description serve to explain the features, advantages and principles of the invention. The drawings are only for the purpose of illustrating preferred and alternative examples of how the invention can be made and used, and are not to be construed as limiting the invention to only the illustrated and described embodiments. Further features and advantage will become apparent from the following and more particular description of the various embodiments of the invention, as illustrated in the accompanying drawings, in which like reference prefer to like elements and wherein:

FIG. 1 is a schematic drawing illustrating two substrates for 3D integration, used in embodiments of the present invention;

FIG. 2 is a schematic drawing illustrating a process for realizing a connecting structure according to a first embodiment of the present invention;

FIG. 3A is a schematic drawing illustrating two substrates undergoing a process of 3D integration according to an embodiment of the present invention;

FIG. 3B is a schematic drawing illustrating the result of 3D integration of two substrates according to an embodiment of the present invention;

FIG. 4 is a schematic drawing illustrating a process for realizing a connecting structure according to a second embodiment of the present invention;

FIGS. 6A, 6B are a schematic drawings illustrating a process for realizing a connecting structure according to a fourth embodiment of the present invention;

FIGS. 7A, 7B are schematic drawings illustrating a 3D system including two substrates according to a fifth embodiment of the present invention;

FIG. 8A is a schematic drawing illustrating two substrates undergoing a process of 3D integration according to the state of the art;

FIG. 8B is a schematic drawing illustrating the result of 3D integration of two substrates according to the state of the art, in absence of an integration misalignment;

FIG. 8C is a schematic drawing illustrating the result of 3D integration of two substrates according to the state of the art, in presence of an integration misalignment.

DETAILED DESCRIPTION

Figure 5:
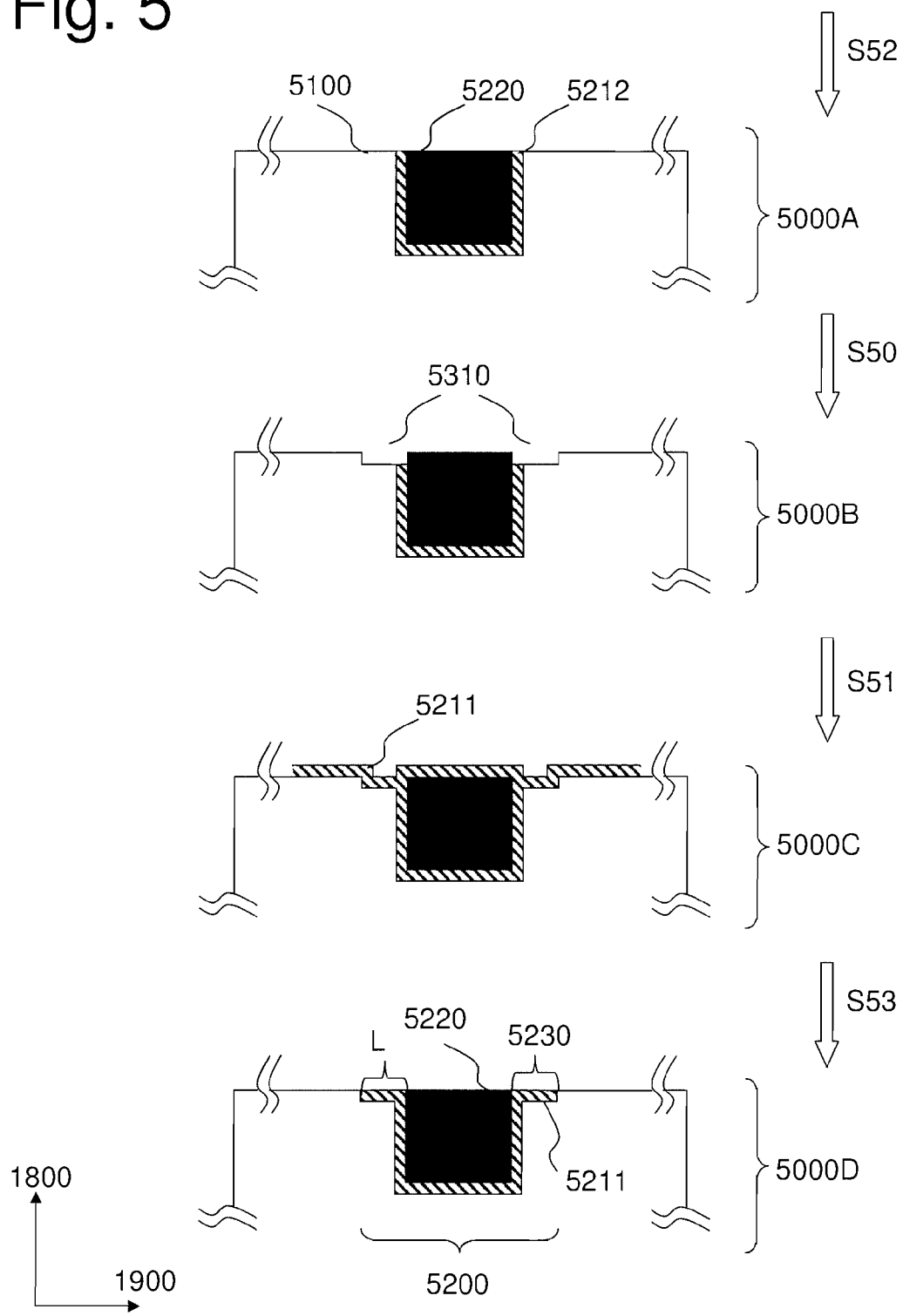
FIG. 5 is a schematic drawing illustrating a process for realizing a connecting structure according to a third embodiment of the present invention.

In the following description, for explanatory purposes, specific details are set forth in order to provide a thorough understanding thereof. It may be evident, however, that the present invention can be practiced without these specific details.

As can be seen in FIG. 8, the shape of the conductive layer 8220 and the diffusion barrier layer 8211 of the connecting structure 8200 of the first semiconductor die 8000, along the surface corresponding to the first surface 8100, might be substantially the same of the shape of the conductive layer 8220 and the diffusion barrier layer 8211 of the connecting structure 8200 of the second semiconductor die 8700, along the surface corresponding to the first surface 8710.

The conductive layer 8220 might be used in order to carry an electric signal and might be realized with a material having electrical properties adapted to the propagation of such a signal. The diffusion barrier layer might be used in order to prevent the material of the conductive layer 8220 from diffusing into the first semiconductor die 8000 or into the second semiconductor die 8700.

By aligning, it is meant that the first semiconductor die 8000 might be placed along direction 1900 in such a way that the surface of the conductive layer 8220 of the connecting structure 8200 of the first semiconductor die 8000 and the surface of the conductive layer 8220 of the connecting structure 8200 of the second semiconductor die 8700 substantially occupy the same area along a plane including direction 1900 and perpendicular to direction 1800. At the same time, by aligning it is meant that the first semiconductor die 8000 might be placed along direction 1900 in such a way that the surface of the diffusion barrier layer 8211 of the connecting structure 8200 of the first semiconductor die 8000 and the surface of the diffusion barrier layer 8211 of the connecting structure 8200 of the second semiconductor die 8700 substantially occupy the same area along the plane including direction 1900 and perpendicular to direction 1800. Such a situation is illustrated in FIG. 8B.

Since the situation illustrated in FIG. 8B might not be achieved due to technological limits, however, a structure must be realized such that, even in the presence of misalignment, diffusion of conducting material in the semiconductor substrates is prevented.

FIG. 1 illustrates a first semiconductor substrate 1000 and a second semiconductor substrate 1700 undergoing a 3D integration. The 3D integration might comprise a bonding process.

The first semiconductor substrate 1000 has at least a first surface 1100 and the second semiconductor substrate 1700 has at least a first surface 1710. Both semiconductor substrates 1000 and 1700 might include a plurality of circuitry, such as transistor, diodes, capacitors, metal lines and vias, identified by reference numerals 1600. Both the first semiconductor substrate 1000 and the second semiconductor substrate 1700 might additionally include further modules, e.g., optical modules, biological modules, memories, and/or power modules not illustrated in FIG. 1. Furthermore, either or both of the first semiconductor substrate 1000 and the second semiconductor substrate 1700 could comprise any of a silicon wafer, a silicon on insulator wafer, a glass substrate, or more generally a substrate.

The first semiconductor substrate 1000 and the second semiconductor substrate 1700 might be integrated by bonding them along a surface corresponding to the first surface 1100 and the first surface 1710 by approaching them to each other along direction 1800 and by applying a predetermined amount of pressure at a predetermined temperature, in a predetermined environment as indicated by arrows 1150.

The bonding may correspond in particular to the technique disclosed in U.S. Pat. No. 6,962,835 or, more preferably, to the technique disclosed in "Enabling 3D Interconnects with Metal Direct Bonding" from Di Cioccio and Al (IITC 2009). It could also be other technique like external thermo compression bonding.

Moreover, both the first semiconductor substrate 1000 and the second semiconductor substrate 1700 include connecting structures 1200 placed at substantially similar positions along a plane, including direction 1900 and perpendicular to direction 1800, such that, when the two semiconductor substrates are approached to each other along direction 1800, connecting structures 1200 of the first semiconductor substrate 1000 enter in contact with corresponding connecting structures 1200 of the second semiconductor substrate 1700. For instance, connecting structure 1201 of the first semiconductor substrate 1000 shall contact connecting structure 1202 of the second semiconductor substrate 1700. Although in FIG. 1 only two connecting structures are illustrated, of course, there could be and usually is many more connecting structures. Furthermore, in this invention, the diffusion barrier structure surrounds the conductive material and provides a barrier between it and the substrate.

FIG. 2 is a schematic drawing illustrating a process for realizing a connecting structure according to a first embodiment of the present invention. More specifically, FIG. 2 illustrates a process of realizing a connecting structure 2200 such as connecting structure 1201 of the first semiconductor substrate 1000, and/or connecting structure 1202 of the second semiconductor substrate 1700, and/or any of connecting structures 1200 of FIG. 1.

A semiconductor substrate 2000A includes a hole 2300, as can be seen in FIG. 2. The hole 2300 might be realized starting from a semiconductor substrate through step S20, by carrying out, for instance, photolithography and etching. The size, shape, depth and position of hole 2300 might be controlled in a manner known in the art of semiconductor manufacturing.

By carrying out a deposition and/or growing step S21, a diffusion barrier layer 2211 is realized on top of semiconductor substrate 2000A so as to obtain semiconductor substrate 2000B. The realization of the diffusion barrier layer 2211 could be performed in a known semiconductor substrate manufacturing process, such as deposition and/or growing, including, for instance, Chemical Vapor Deposition (CVD), Physical Vapor Deposition (PVD), Epitaxy or other techniques. The diffusion barrier layer might be a layer of material having the property of blocking the diffusion of metal atoms such as tantalum (TA), tantalum nitride (TAN), or silicon nitride (SI3N4).

Subsequently, through a step S22A, that might consist of a seed deposition of a conductive layer 2221, the semiconductor substrate 2000C is obtained. The seed deposition process could be performed with techniques known in the art such as PVD seed or CVD seed. The conductive layer 2221 might be, for instance, copper, silver, gold or any other material having electrical conductivity.

Subsequently, through a step S22B that consists of a deposition of a conductive layer 2222, the semiconductor substrate 2000D is obtained. The step S22B might consist of electrochemical deposition (ECD). The conductive layer 2222 might be the same material as the conductive layer 2221, which might facilitate the adhesion of the conductive layer 2222 on conductive layer 2221. Alternatively, the conductive layer 2222 might be a material differing from the conductive layer 2221, which might speed up the growing process, or might provide a better electrical conductivity, or might reduce production costs.

Subsequently, the semiconductor substrate 2000D could be subjected to a step S23 consisting in a chemical mechanical polishing (CMP) so as to obtain semiconductor substrate 2000E.

Thanks to this process, a connecting structure 2200 such as the one illustrated in the semiconductor substrate 2000E is obtained.

The connecting structure 2200 includes a diffusion barrier layer 2211 and a conductive layer 2220. Moreover, the diffusion barrier layer 2211 has a surface 2230 substantially parallel to the first surface 2100 of the semiconductor substrate 2000E. The size of the end surface 2230 in this embodiment is substantially determined by the thickness d of the material forming the diffusion barrier layer 2211 deposited during step S21. Accordingly, it might be possible to control the length L of the end surface 2230, along at least direction 1900, by controlling the amount of deposited material during step S21.

In semiconductor substrate 2000E, the surface 2230 of diffusion barrier layer 2211 can act as a diffusion barrier structure, thereby preventing the diffusion of elements out of a conductive layer of a second semiconductor substrate, into semiconductor substrate 2000E, even in the presence of misalignment.

FIG. 3A is a schematic drawing illustrating two substrates undergoing a process of 3D integration according to the first embodiment of the present invention. More specifically, FIG. 3A illustrates a first semiconductor substrate 1000 and a second semiconductor substrate 1700 undergoing 3D integration along the direction 1800.

As can be seen in FIG. 3A, the first semiconductor substrate 1000 might have a lateral misalignment along direction 1900 with respect to the second semiconductor substrate 1700. The lateral misalignment along direction 1900 might have a value M, for instance, in the order of approximately 20 nm to approximately 1 μm, or, for instance, even more than 1 μm. Both the first semiconductor substrate 1000 and the second semiconductor substrate 1700 include a connecting structure 2200 as obtained by the process described in FIG. 2. The connecting structure 2200 thus has a surface 2230 having a length, in direction 1900 corresponding to a value L typically in the order of 20 nm to 1 μm, acting as a diffusion barrier structure.

FIG. 3B is a schematic drawing illustrating the result of 3D integration of two substrates according to an embodiment of the present invention. More specifically, FIG. 3B illustrates a semiconductor system obtained by the 3D integration of the first semiconductor substrate 1000 and the second semiconductor substrate 1700.

In one alternative embodiment, the length L of surface 2230 of the first semiconductor substrate 1000 might be longer than the length of the conductive layer 2220 of the second semiconductor substrate 1700 along direction 1900. By choosing the length L in such a manner, it is possible to ensure that diffusion is prevented, whenever a contact between the conductive layer 2220 of the first semiconductor substrate 1000 and the conductive layer 2220 of the second semiconductor substrate 1700 is realized.

As can be seen in FIG. 3B, the connecting structure 2200 of the first semiconductor substrate 1000 are misaligned with respect to the connecting structure 2200 of the second semiconductor substrate 1700. However, the conductive layer 2220 of the connecting structure 2200 of the second semiconductor substrate 1700 can be prevented from diffusing into the first semiconductor substrate 1000 thanks to the diffusion barrier layer 2211 of the connecting structure 2200 of the first semiconductor substrate 1000. Therefore, unlike in the prior art as illustrated in FIG. 8C, where conductive material could diffuse through a region 8500, conductive layer 2200 of the second semiconductor substrate 1700 is always placed over a region including conductive layer 2200 of the first semiconductor substrate 1000 or over a region including conductive layer 2200 and surface 2230 of the first semiconductor substrate. In such a way, diffusion of the material composing conductive layer 2200 into the semiconductor substrate 1000 can be prevented.

More specifically, as can be seen in FIG. 3A, the diffusion barrier layer 2211 of the connecting structure 2200 of the first semiconductor substrate 1000 could have an end surface 2230 having a length L in the direction 1900 of the misalignment. By choosing the length value L so as to be at least as big as the misalignment value M, the result illustrated in FIG. 3B can be obtained. More specifically, by choosing the length L in the direction 1900 of the surface 2230 so as to be at least corresponding to the misalignment value M in the direction 1900, it is ensured that the conductive layer 2220 of connecting structure 2200 of the second semiconductor substrate 1700 is only placed over the conductive layer 2220 of the connecting structure 2200 of the first semiconductor substrate 1000 or the surface 2230 of the diffusion barrier layer 2211 of the connecting structure 2200 of the first semiconductor substrate 1000. In other words, by choosing a length L of the surface 2230 so as to be at least as big as a misalignment value M, the diffusion of the electrically conductive material 2220 of the connecting structure 2200 of the second semiconductor substrate 1700 into the first semiconductor substrate 1000 can be prevented.

Alternatively, or in addition, the length L of the surface 2230 could be set as a function of, for instance, a maximum misalignment value M in consecutive 3D integrations, or an average misalignment value M in consecutive 3D integrations. In this manner, it can be insured that, in absolute terms, or on average, the misalignment will not cause a diffusion of conductive material 2200 in the semiconductor substrates 1000 and/or 1700.

Alternatively, or in addition, the length L of the surface 2230 in the first semiconductor substrate 1000 could be set so as to be at least as big as the length of the conductive material 2200 of the connecting structure of the second semiconductor substrate 1700. In this manner, it is guaranteed that, whenever a contact between the conductive material 2200 of the first semiconductor substrate 1000 and of the second semiconductor substrate 1700 is achieved, diffusion will be prevented. This is advantageous in cases where the value of the misalignment is not known, whereas the length of the conductive material 2200 of the connecting structure of the second semiconductor substrate 1700 is known.

Moreover, the misalignment value M could be different for different locations of the semiconductor substrate 1000. For example, in addition to a misalignment due to a tolerance of a manufacturing or a handling machine, there could be a misalignment due to pressure being exerted on the semiconductor substrate, or due to a temperature gradient across the substrate. In the cases were the misalignment value M is not constant across the wafer, this could be taken into account when choosing the value L of the surface 2230 for different connecting structures 2200 located in different parts of the wafer.

FIG. 4 is a schematic drawing illustrating a process for realizing a connecting structure 4200 according to a second embodiment of the present invention. More specifically, FIG. 4 illustrates a process of realizing a connecting structure 4200 such as connecting structure 1201 of the first semiconductor substrate 1000, and/or connecting structure 1202 of the second semiconductor substrate 1700, and/or any of connecting structures 1200 of FIG. 1.

As can be seen in FIG. 4, a semiconductor substrate 4000A having a first hole 4320 and a second hole 4310 encircling the first hole toward the surface 4100 could be obtained by a step S40. The first hole 4320 might be realized starting from a semiconductor substrate through step S40, by carrying out, for instance, photolithography and etching. The size, shape, depth and position of first hole 4320 might be controlled in a manner known in the art of semiconductor manufacturing. Similarly, the second hole 4310 might be realized starting from a bulk semiconductor substrate through step S40, by carrying out, for instance, the well-known processes of photolithography and etching. The size, shape, depth and position of second holes 4310 might be controlled in a manner known in the art of semiconductor manufacturing. Alternatively, or in addition, both the first hole 4320 and the second holes 4310 could be realized in a single photolithographic step.

The length of the second holes 4310, in at least the direction 1900, could be chosen so as to correspond to a desired length L.

Subsequently, a diffusion barrier layer 4211 is deposited on semiconductor substrate 4000A so as to obtain semiconductor substrate 4000B via step S41. Techniques for carrying out step S41 could be substantially similar to techniques for carrying out step S21 in FIG. 2. Moreover, the diffusion barrier layer 4211 could be substantially similar to the diffusion barrier layer 2211 in FIG. 2.

Subsequently, a conductive layer 4221 and a conductive layer 4222 are deposited on the semiconductor substrate 4000B so as to obtain, respectively, semiconductor substrates 4000C and 4000D via steps S42A and S42B. Steps S42A and S42B could be substantially similar to step S22A and S22B in FIG. 2. Moreover, conductive layers 4221 and conductive layer 4222 could be substantially similar to conductive layer 2221 and conductive layer 2222 in FIG. 2, respectively.

Finally, via a step S43, semiconductor substrate 4000E is obtained. Step S43 could be substantially similar to step S23 in FIG. 2. Following the step S43, the material of the diffusion barrier layer 4211 remaining in the second holes 4310 has a length, in at least direction 1900, corresponding to the desired value L, in at least a surface region 4230 of the surface 4100, thus acting as a diffusion barrier structure in a 3D structure, even in the presence of misalignment.

Thanks to the process outlined in FIG. 4, a connecting structure 4200 could be obtained, including a conductive element 4220 and a diffusion barrier layer 4211. The conductive element 4220 could be substantially the same as the conductive element 2220 in FIG. 2. On the other hand, thanks to the second holes 4310, the diffusion barrier layer 4211 could be substantially thinner in the bulk than the diffusion barrier layer 2211 of FIG. 2. Although being thinner, the diffusion barrier layer 4211, deposited in the holes 4310, still provides a surface 4230 substantially similar to the surface 2230 of the FIG. 2. Accordingly, the same advantages obtained by the connecting structure 2200 of FIG. 2 could be obtained by the connecting structure 4200 of FIG. 4. Moreover, since growing of a diffusion barrier layer 4211 in step S41 could be a relatively long operation, the possibility of growing a thinner layer 4211 while still realizing a large surface 4230 having a desired length L, could be advantageous both in terms of reduced costs and in terms of reduced processing time.

In semiconductor substrate 4000E, the surface 4230 of diffusion barrier layer 4211 can act as a diffusion barrier structure, thereby preventing the diffusion of elements out of a conductive layer of a second semiconductor substrate, into semiconductor substrate 4000E, even in the presence of misalignment.

FIG. 5 is a schematic drawing illustrating a process for realizing a connecting structure 5200 according to a third embodiment of the present invention. More specifically, FIG. 5 illustrates a process of realizing a connecting structure 5200 such as connecting structure 1201 of the first semiconductor substrate 1000, and/or connecting structure 1202 of the second semiconductor substrate 1700, and/or any of connecting structures 1200 of FIG. 1.

FIG. 5 illustrates a semiconductor substrate 5000A with a conductive layer 5220 and a diffusion barrier layer 5212 achieved by a step S52. Techniques for carrying out step S52 could be substantially similar to techniques for carrying out steps S22A and S22B in FIG. 2.

Subsequently, a semiconductor substrate 5000B having a hole 5310 on the diffusion barrier layer 5212 surrounding the conductive layer 5220 or near the surface 5100 is obtained by a step S50. The size, shape, depth and position of hole 5310 might be controlled in a manner known in the art of semiconductor manufacturing. Techniques for carrying out step S50 could be substantially similar to techniques for carrying out step S20 in FIG. 2.

Subsequently, a diffusion barrier layer 5211 is deposited on semiconductor substrate 5000B so as to obtain semiconductor substrate 5000C via step S51. Techniques for carrying out step S51 could be substantially similar to techniques for carrying out step S21 in FIG. 2. Moreover, the diffusion barrier layer 5211 could be substantially similar to the diffusion barrier layer 2211 in FIG. 2. During this step, at least the hole 5310 is filled with the barrier layer material.

Finally, via a step S53, semiconductor substrate 5000D is obtained. Step S53 could be a CMP substantially similar to step S23 in FIG. 2 to remove excessive material. Following the step S43, the material of diffusion barrier layer 5211 remaining in the holes 5310 could have a length, in at least direction 1900, corresponding to the desired value L, in at least a surface 5230, acting as a diffusion barrier structure.

By carrying out the process described in FIG. 5, it is possible to realize a diffusion barrier layer 5211 after a conductive material has already been deposited. Moreover, it is possible to realize a surface 5230 having a desired length L, with a relatively thin barrier diffusion layer 5211. This could have the advantage of increasing manufacturing speed and therefore reducing costs.

In semiconductor substrate 5000D, the surface 5230 of diffusion barrier layer 5211 can act as a diffusion barrier structure, thereby preventing the diffusion of elements out of a conductive layer of a second semiconductor substrate, into semiconductor substrate 5000D, even in the presence of misalignment.

Figure 6B:
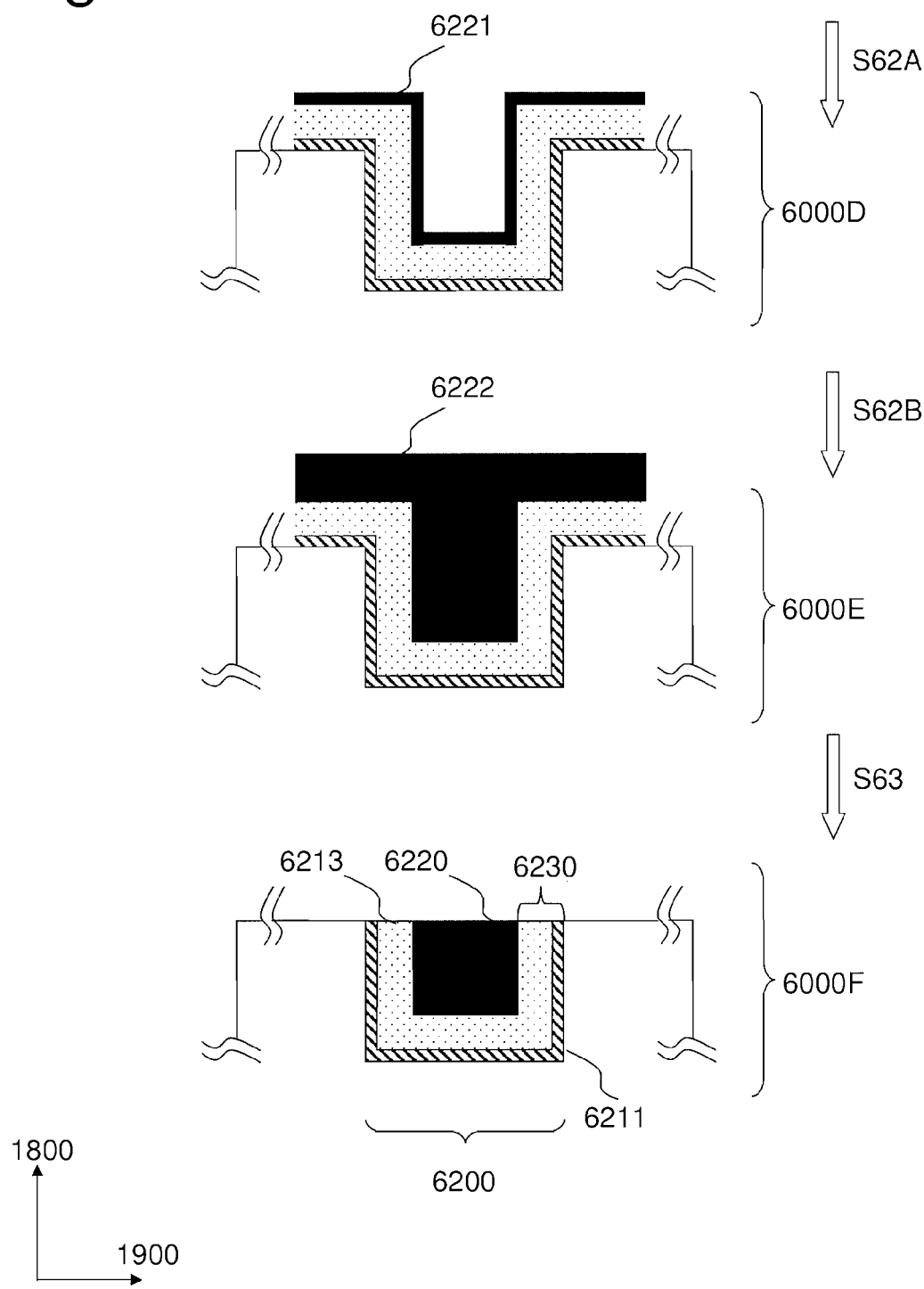

FIGS. 6A and 6B are schematic drawings illustrating a process for realizing a connecting structure 6200 according to a fourth embodiment of the present invention. More specifically, FIGS. 6A and 6B illustrates a process of realizing a connecting structure 6200 such as connecting structure 1201 of the first semiconductor substrate 1000, and/or connecting structure 1202 of the second semiconductor substrate 1700, and/or any of connecting structures 1200 of FIG. 1.

As can be seen in FIG. 6A, a semiconductor substrate 6000A having a first hole 6320 is obtained by a step S40. The first hole 6320 might be realized starting from a bulk semiconductor substrate through step S60. Techniques for carrying out step S60 could be substantially similar to techniques for carrying out step S20 in FIG. 2.

Subsequently, a diffusion barrier layer 6211 is deposited on semiconductor substrate 6000A so as to obtain semiconductor substrate 6000B via step S61A. Techniques for carrying out step S61A could be substantially similar to techniques for carrying out step S21 in FIG. 2. Moreover, the diffusion barrier layer 6211 could be substantially similar to the diffusion barrier layer 2211 in FIG. 2.

Subsequently, a second barrier layer 6213 is deposited on semiconductor substrate 6000B so as to obtain semiconductor substrate 6000C via step S61B. The second barrier layer 6213 is deposited onto diffusion barrier layer 6211. The second layer 6213 is also acting as a diffusion barrier layer and could be, for instance, TiN, and has a growth rate higher than the diffusion barrier layer 6211.

Second barrier layer 6213 can have a faster growth rate than diffusion barrier layer 6211 thanks to the working conditions in which it is deposited. That is, the growth rate of diffusion barrier layer 6211 can be influenced by the fact that diffusion barrier layer 6211 is deposited on semiconductor substrate 6000A, while the growth rate of second barrier layer 6213 could be faster, due to the fact that second layer 6213 can be deposited on the diffusion barrier layer 6211. In other words, due to the constraint of realizing a deposition of diffusion barrier layer 6211, on semiconductor substrate 6000A, which has good characteristics and no holes, the deposition of diffusion barrier layer 6211 could be slow. On the other hand, second barrier layer 6213 could be deposited with a faster growth rate by being deposited on diffusion barrier layer 6211 instead of on semiconductor substrate 6000A.

Alternatively, second layer 6213 and diffusion barrier layer 6211 could be realized with the same material, among the materials described for second layer 6213 and diffusion barrier layer 6211, and only the growth rate of the material could be increased during the deposition so as to realize a higher quality layer in a first part of the deposition, by using a slower growth rate, and a faster growing layer in a second part of the deposition, by using a quicker growth rate.

Subsequently, a conductive layer 6221 and a conductive layer 6222 are deposited on the second layer 6213 of semiconductor substrate 6000C so as to obtain, respectively, semiconductor substrates 6000D and 6000E via steps S62A and S62B. Steps S62A and S62B could be substantially similar to step S22A and S22B in FIG. 2. Moreover, conductive layers 6221 and conductive layer 6222 could be substantially similar to conductive layer 6221 and conductive layer 6222 in FIG. 2, respectively.

In this embodiment, as well as the previous embodiments, the seed conductive layer 6221 might not be necessary and a single deposition of a conductive layer 6222 could be performed instead of a deposition of a conductive layer 6221 and a conductive layer 6222.

Finally, via a step S63, semiconductor substrate 6000F is obtained. Step S63 to remove material could be a CMP process substantially similar to step S23 in FIG. 2. Following the step S63, the combined diffusion barrier layers 6211 and 6123 present a surface 6230, acting as a diffusion barrier structure.

By carrying out the process outlined in FIGS. 6A and 6B, a diffusion barrier structure is realized with a surface 6230, having a length L in at least a direction 1900, in a time relatively shorter than a time required for realizing a diffusion barrier layer, having a comparable length in the direction 1900. In such a manner, a diffusion barrier structure 6211, 6213, having a surface 6230, could take less time to perform than step S21 of FIG. 2, in which a thicker diffusion barrier layer 2211 could be deposited. Accordingly, manufacturing costs could be reduced.

In semiconductor substrate 6000F, the surface 6230 of diffusion barrier layers 6211 and 6213 can act as a diffusion barrier structure, thereby preventing the diffusion of elements out of a conductive layer of a second semiconductor substrate, into semiconductor substrate 6000F, even in the presence of misalignment.

FIGS. 7A and 7B illustrate a semiconductor system 7000 in accordance with a fifth embodiment of the present invention. FIG. 7A is a section view of the system, taken along a plane perpendicular to the two semiconductor substrates. FIG. 7B is a top view of the system, taken along a plane perpendicular to the plane of FIG. 7A. The semiconductor system 7000 is obtained by integrating, via a 3D integration, a first semiconductor substrate 1000 and a second semiconductor substrate 1700. Both the first 1000 and second 1700 semiconductor substrate include at least one connecting structure 2200. The connecting structure 2200 could be realized with any of the processes defined by the previous embodiments. Reference 2211A indicates the diffusion barrier of the first semiconductor substrate 1000, while reference 2211B indicates the diffusion barrier of the second semiconductor substrate 1700.

Moreover, as can be seen in top view of FIG. 7B, the first semiconductor substrate 1000 could be misaligned with respect to the second semiconductor substrate 1700 both along direction 1800 and along direction 1900. The misalignment values along those two directions are M1800 and M1900 respectively. In such a case, the dimensions 7810, 7820, 7910, 7920 of the diffusion barrier 2211A could be chosen so as follows:
- dimension 7810, along direction 1800 could be of any value, preferably at least a value which can be manufactured;
- dimension 7910, along direction 1900 could be of any value, preferably at least a value which can be manufactured;
- dimension 7820, along direction 1800 could be chosen so as to correct for the misalignment M1800 in the manner described in the previous embodiments. For instance, it could be chosen to correspond to at least the misalignment value M1800;
- dimension 7920, along direction 1900 could be chosen so as to correct for the misalignment M1900 in the manner described in the previous embodiments. For instance, it could be chosen to correspond to at least the misalignment value M1900.

Alternatively, or in addition, dimension 7810 could be chosen so as to correspond to dimension 7820, alternatively, or in addition, dimension 7910 could be chosen so as to correspond to dimension 7920 so as to simplify the design and the manufacturing.

Alternatively, or in addition, assuming the M1800 is larger than M1900, dimensions 7810, 7910, 7920 could be chosen so as to correspond to dimension 7820, so as to further simplify the design process.

By realizing the semiconductor system 7000 as described above, conductive region 2220A of the first semiconductor substrate 1000 and conductive region 2220B of the second semiconductor substrate 1700 would overlap at least partially and conductive region 2220B would only overlap a region including conductive region 2220A and the diffusion barrier 2211A of the first semiconductor substrate 1000. In such a manner, diffusion of the conductive element of and conductive region 2220B into the first semiconductor substrate 1000 could be prevented.

Although in some of the previous embodiments, reference has been made to the process for realizing, and the dimensions of, the connecting structure of the first semiconductor substrate 1000 only, the same teaching could, of course, be applied to the second semiconductor substrate 1700 as well.

In some embodiments of the present invention, the semiconductor substrate integrating the connecting structure, such as semiconductor substrates 1000, 1700, 2000E, 4000E, 5000D, 6000F, including connecting structures 1200, 1201, 1202, 4200, 5200, 6200, could undergo a layer transfer process of transferring a layer structure along a plane substantially parallel to the surface containing direction 1900 and perpendicular to direction 1800. The transfer process could be performed by implantation of the substrate by means of ions to form a predetermined weakening layer inside, and could include a step of heating of the substrate so as to detach the to be transferred layer along the weakening layer in which ions have been implanted. Detachment can also be realized by a mechanical action. Alternatively, the transfer process could be performed by grinding and/or etching the material in excess of the transferred layer. The transfer process could be carried out before the realization of the connecting structure, or after. Moreover, the transfer process could be carried out before the 3D integration process, or after.

In some embodiments of the present invention, the semiconductor substrate integrating the connecting structure, such as semiconductor substrates 1000, 1700, 2000E, 4000E, 5000D, 6000F, could be any kind of semiconductor wafer, such as a Silicon (Si) wafer, a Gallium Arsenide (GaAs) wafer, a Silicon on Insulator (SOI) wafer, a Germanium (Ge) wafer.

The invention has been presented in the context of two substrates undergoing a process of 3D integration. The term substrate may correspond to a semiconductor wafer, as for example a 200 mm or 300 mm silicon or SOI wafer. It may also correspond to a die, i.e., a piece of a wafer after it has been diced into individual components. In other terms, the inventive concept is applicable to 3D integration performed at the wafer or at the die level.

In the above description, the terms growing, depositing, realizing are used interchangeably to indicate known techniques in the field of semiconductor manufacturing such as any of Chemical Vapor Deposition (CVD), Epitaxy, Physical Vapor Deposition (PVD), Sputter deposition, printing techniques.

What is claimed is:

1. A semiconductor system, comprising:
a first substrate and a second substrate, with both substrates including a connecting structure, wherein each of the first and second substrates has at least a first surface, and is 3D integrated with the other substrate along the first surface, wherein the 3D integration is misaligned and has a lateral misalignment in at least one dimension having a misalignment value in a direction of lateral misalignment parallel to the first surface of each of the first substrate and the second substrate; and
each connecting structure includes a diffusion barrier structure for preventing diffusion of elements out of a conductive layer of the substrate, with the diffusion barrier structure of the first substrate preventing diffusion of elements from a conductive layer of the second substrate into the first substrate and the diffusion barrier structure of the second substrate preventing diffusion of elements from a conductive layer of the first substrate into the second substrate, and with each diffusion barrier structure configured so that a first end surface of each diffusion barrier structure, which is the most outward surface of the diffusion barrier oriented substantially parallel to the first surface of that substrate, has a length in the direction of the lateral misalignment, with the length being at least 20 nm and greater than the misalignment value so as to prevent diffusion of elements out of a conductive layer of the other substrate, and wherein the surface of the diffusion barrier structure is flush with the surface of the connecting structure and the substrate in which it is embedded.

2. The semiconductor system according to claim 1, wherein the diffusion barrier structure comprises a diffusion barrier layer, and wherein the length is greater than a layer thickness of the diffusion barrier layer.

3. The semiconductor system according to claim 1, wherein the length is at least as long as a length of the conductive layer of the second substrate along the direction of the misalignment.

4. The semiconductor system according to claim 1, wherein the connecting structure further includes at least a conductive layer so that the conductive layer is separated from the first substrate by at least the diffusion barrier structure.

5. The semiconductor system according to claim 1, wherein the diffusion barrier structure comprises a diffusion barrier layer.

6. The semiconductor system according to claim 5, wherein the diffusion barrier structure includes a second layer on the diffusion barrier layer wherein the second layer has a growing rate higher than a growing rate of the diffusion barrier layer.

7. The semiconductor system according to claim 1, wherein the diffusion barrier layer is one of tantalum, tantalum nitride, or silicon nitride.

8. The semiconductor system according to claim 1, wherein the connecting structure is defined by a hole in the substrate, the diffusion barrier structure being disposed in the hole on a sidewall and a bottom of the hole, and conductive material is disposed in the hole on the diffusion barrier structure, wherein the diffusion barrier structure has a thickness on the sidewall of the hole that is equal to or greater than the misalignment value.

9. The semiconductor system according to claim 1, wherein the length of the first end surface of each diffusion barrier structure is between 20 nm and 1 µm.

10. The semiconductor system according to claim 1, wherein the diffusion barrier structure comprises at least one of tantalum, tantalum nitride, or silicon nitride.

11. A process for fabricating a connecting structure in a semiconductor substrate, the process comprising:
forming a first hole in a first surface of a first substrate;
forming a second hole in second surface of a second substrate;
growing a first diffusion barrier structure on the first substrate, the first diffusion barrier structure disposed at least partially within the first hole;
growing a second diffusion barrier structure on the second substrate, the second diffusion barrier structure disposed at least partially within the second hole;
providing a first conductive material in the first hole of the first substrate over the first diffusion barrier structure, the first diffusion barrier structure and the first conductive material defining a first connecting structure of the first substrate;
providing a second conductive material in the second hole of the second substrate over the second diffusion barrier structure, the second diffusion barrier structure and the second conductive material defining a second connecting structure of the second substrate;
3D integrating the first substrate and the second substrate and bonding the first connecting structure to the second connecting structure along first surface of the first substrate and the second surface of the second substrate, wherein the 3D integration is misaligned and has a lateral misalignment in at least one dimension having a misalignment value in a direction of lateral misalignment parallel to the first surface of the first substrate and the second surface of the second substrate;
prior to 3D integrating the first substrate and the second substrate, forming the first diffusion barrier structure to have a first end surface flush with a surface of the first conductive material and the first surface of the first substrate and oriented substantially parallel to the first surface of the first substrate, the first end surface located adjacent the second surface of the second substrate, the first end surface having a first length in the direction of the lateral misalignment, the first length being at least 20 nm and greater than the misalignment value so as to prevent diffusion of elements from the second conductive material of the second substrate into the first substrate; and
prior to 3D integrating the first substrate and the second substrate, forming the second diffusion barrier structure to have a second end surface flush with a surface of the second conductive material and the second surface of the second substrate and oriented substantially parallel to the second surface of the second substrate, the second end surface located adjacent the first surface of the first substrate, the second end surface having a second length in the direction of the lateral misalignment, the second length being at least 20 nm and greater than the misalignment value so as to prevent diffusion of elements from the first conductive material of the first substrate into the second substrate.

12. The process according to claim 11, which further comprises separating the first conductive material from the first substrate by at least the first diffusion barrier structure.

13. The process according to claim 11, further comprising providing the first conductive material in the first hole of the first substrate before forming at least a portion of the first diffusion barrier structure.

14. The process according to claim 11, wherein growing a first diffusion barrier structure on the first substrate comprises growing a diffusion barrier layer at a first growth rate and then growing a second layer on the diffusion barrier layer at a second growth rate higher than the first growth rate.

15. The process according to claim 11, further comprising forming the first diffusion barrier structure to comprise a first diffusion barrier layer having an average layer thickness equal to or greater than the misalignment value.

* * * * *

UNITED STATES PATENT AND TRADEMARK OFFICE
CERTIFICATE OF CORRECTION

PATENT NO. : 9,224,704 B2  Page 1 of 1
APPLICATION NO. : 13/219099
DATED : December 29, 2015
INVENTOR(S) : Didier Landru It is certified that error appears in the above-identified patent and that said Letters Patent is hereby corrected as shown below:

In the claims:

CLAIM 11, COLUMN 16, LINE 15, change "in second surface" to --in a second surface--

CLAIM 11, COLUMN 16, LINE 35, change "along first surface" to --along the first surface--

Signed and Sealed this
Seventh Day of June, 2016

Michelle K. Lee
*Director of the United States Patent and Trademark Office*